US007985931B2

(12) United States Patent
Akama et al.

(10) Patent No.: US 7,985,931 B2

(45) Date of Patent: Jul. 26, 2011

(54) ENCLOSURE FOR A CONNECTOR

(75) Inventors: Junichi Akama, Shinagawa (JP); Mitsuru Kobayashi, Shinagawa (JP)

(73) Assignee: Fujitsu Component Limited, Tokyo (JP)

( * ) Notice: Subject to any disclaimer, the term of this patent is extended or adjusted under 35 U.S.C. 154(b) by 865 days.

(21) Appl. No.: 11/980,374

(22) Filed: Oct. 31, 2007

(65) Prior Publication Data

US 2008/0310086 A1 Dec. 18, 2008

(30) Foreign Application Priority Data

Jun. 15, 2007 (JP) ................................ 2007-159036

(51) Int. Cl.
*H01R 4/00* (2006.01)
*H05K 9/00* (2006.01)

(52) U.S. Cl. .................... 174/363; 174/384; 361/679.32

(58) Field of Classification Search .................. 174/350, 174/377, 382, 363, 384; 361/816, 818, 679.32
See application file for complete search history.

(56) References Cited

U.S. PATENT DOCUMENTS

| | | | | |
|---|---|---|---|---|
| 5,259,792 | A * | 11/1993 | Beck et al. | 439/607.49 |
| 6,373,692 | B1 * | 4/2002 | Cheng | 361/679.59 |
| 6,919,505 | B2 * | 7/2005 | Cox | 174/382 |
| 7,511,230 | B2 * | 3/2009 | Cochrane | 174/382 |
| 2006/0209523 | A1 * | 9/2006 | Cochrane | 361/818 |

FOREIGN PATENT DOCUMENTS

| | | |
|---|---|---|
| JP | 2001-345150 | 12/2001 |
| JP | 2003-59593 | 2/2003 |

* cited by examiner

*Primary Examiner* — Hung V Ngo
(74) *Attorney, Agent, or Firm* — Staas & Halsey LLP

(57) ABSTRACT

An enclosure for a connector is disclosed.

The enclosure includes two or more enclosure parts, each having a joint such that the enclosure parts are fit together to constitute the enclosure. The joint may have a continuation of linear segments to form a shape like mountains, wherein the length of each segment is smaller than a wavelength corresponding to an operational frequency.

18 Claims, 6 Drawing Sheets

ENCLOSURE FOR A CONNECTOR

BACKGROUND OF THE INVENTION

1. Field of the Invention

The present invention relates to an enclosure for connectors for transmitting a high-speed and high-density information signal.

2. Description of the Related Art

Conventionally, connectors for high-speed serial data transmission have been developed, wherein the number of components is reduced, and physical dimensions of the connector are reduced without sacrificing electric performance, latch performance, and a connection force. The connectors include a shielding configuration for reducing noise, for example, Japanese Patent Publication No. 2001-345150.

Such a countermeasure against the noise is also applied to connectors for high-speed and high-density balanced transmission as described in, for example, Japanese Patent Publication No. 2003-059593.

Although a cable harness has a noise shielding structure, since signal lines are exposed in a connector, an enclosure of the connector is provided with a noise shielding structure so that noise entering into the connector may be intercepted and so that noise may not leak out of the connector. This is for preventing malfunctioning of a computer, and the like, due to the noise invading into the signal line of the cable harness.

Recently and continuing, the clock frequency of CPUs (central processing unit) is increasing to the order of GHz. Accordingly, connectors are required to be capable of handling several GHz to dozens of GHz. In this case, the wavelength of the information signal transmitted by the signal line based on the clock frequency ranges from dozens of cm to several cm. Accordingly, shielding of noise at the connector becomes more important than ever, that is, a still more stringent countermeasure against the noise is required.

SUMMARY OF THE INVENTION

Then, the present invention provides an enclosure for a connector that has an improved noise shielding characteristic for transmitting a high-speed and high-density information signal.

The present invention provides an enclosure for a connector that substantially overcomes one or more of the problems caused by the limitations and disadvantages of the related art.

Features of embodiments of the present invention are set forth in the description that follows, and in part will become apparent from the description and the accompanying drawings, or may be learned by practice of the invention according to the teachings provided in the description. Problem solutions provided by an embodiment of the present invention may be realized and attained by an enclosure for a connector particularly pointed out in the specification in such full, clear, concise, and exact terms as to enable a person having ordinary skill in the art to practice the invention.

To achieve these solutions and in accordance with an aspect of the invention, as embodied and broadly described herein, an embodiment of the invention provides an enclosure for a connector as follows.

An aspect of the present invention provides an enclosure for a connector. The enclosure is for accommodating a connecting section where a signal line for transmitting an information signal and a terminal (connector) for sending/receiving an information signal between the signal line and an external apparatus are connected, wherein the enclosure is made of a conductive material, is divided into two or more enclosure parts, and a joint between the enclosure parts includes two or more straight line sections or curved sections, each of which sections is shorter than the wavelength corresponding to the frequency of the information signal.

Here, the joint structured by straight line sections may be shaped like a rectangular pulse shape, a continuation of mountain shapes, a saw-tooth pulse shape; and the joint structured by curved sections may be shaped like a continuation of semicircles in the same phase, and a continuation of sinusoidal forms, each for a ½ cycle period in the same phase.

Further, the joint is formed at an angle with reference to a sidewall surface of the enclosure, to which the joint is formed, wherein the angle may be desirably determined, including 90°.

Further, the enclosure is divided in two parts, namely, a first enclosure part having a joint and a second enclosure part having a joint that fits to the joint of the first enclosure part. Further, the signal line enters the enclosure from a first opening prepared on a first end of the first enclosure part and the second enclosure part that are fit. The terminal is provided at a second opening prepared on a second end of the first enclosure part and the second enclosure part, the second end countering the first end. Further, the joint of the first enclosure part and the second enclosure part may be formed between the first opening and the second opening so that the first opening and the second opening may be in communication with each other.

Further, the joints constituted by two or more straight lines or curved lines, as applicable, of the first enclosure part and the second enclosure part may be provided in two or more steps, wherein each step is separated from the other step(s) with a level difference in a thickness direction of the sidewall of the first enclosure part and the second enclosure part.

Further, each of the steps constituted by the straight lines or curved lines, as applicable, may be arranged with a phase that is different from the other step(s).

According to the present invention, an enclosure for a connector for transmitting a high-speed and high-density information signal is realized, wherein improved noise shielding is obtained.

DESCRIPTION OF THE PREFERRED EMBODIMENTS

In the following, embodiments of the present invention are described with reference to the accompanying drawings.

According to the embodiments, the enclosure for a connector of the present invention is applied to a connector for high-speed and high-density balanced transmission. Nevertheless, the enclosure for a connector of the present invention may be applied to other connectors.

Figure 1:
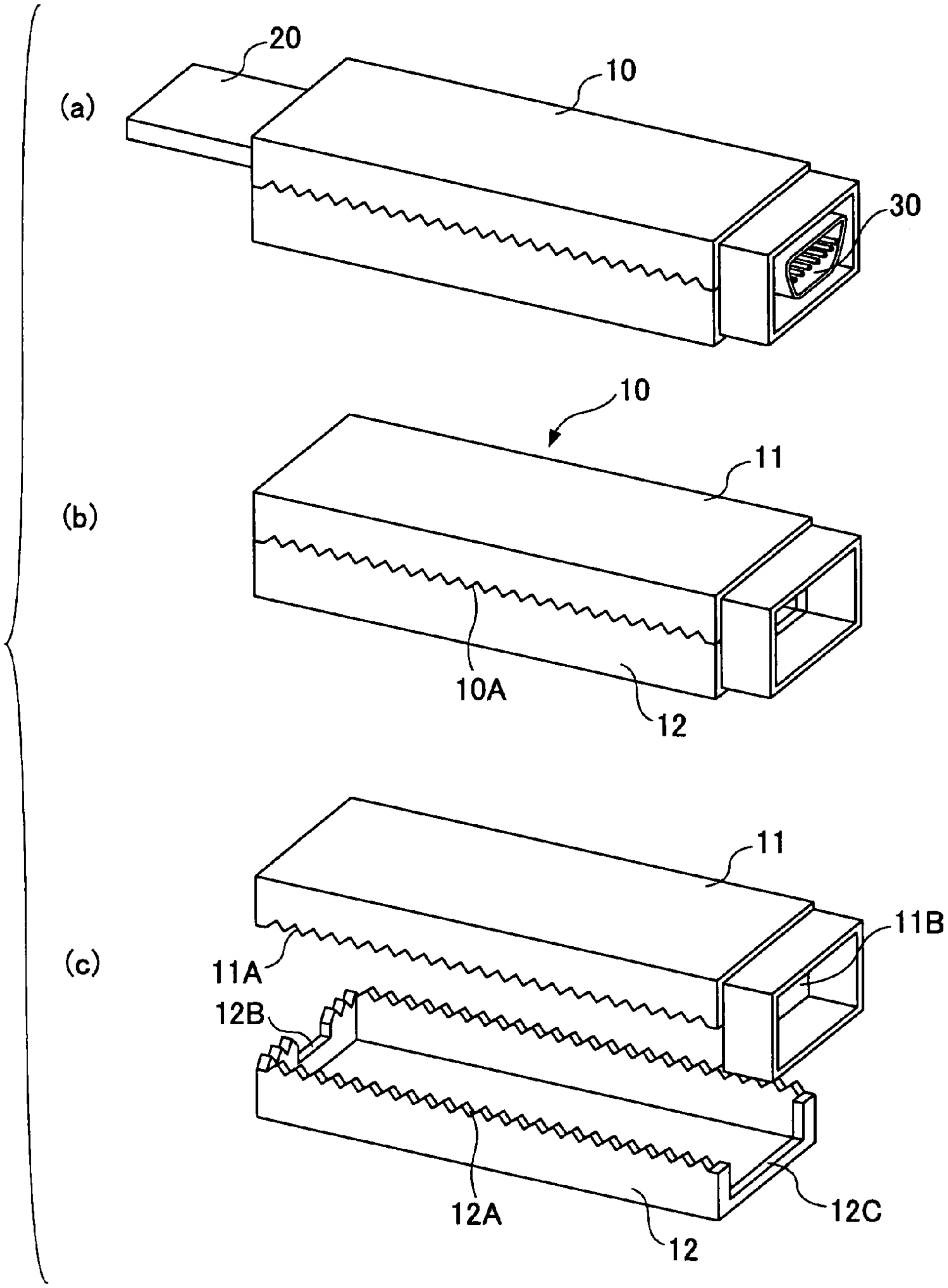
FIG. 1 is a perspective diagram showing the composition of an enclosure for a connector according to Embodiment 1 of the present invention.

FIG. 1 is a perspective diagram showing the structure of an enclosure 10 for a connector according to Embodiment 1 of the present invention. The enclosure 10 is made of a conductive material, such as copper alloy, that has a shielding effect to an electromagnetic wave.

The enclosure 10 can be used for accommodating a high-speed transmission connector that is connected to a cable harness for connecting computers, and a cable harness for connecting a computer and a peripheral device, such as a server, a switchboard, and a router.

The enclosure 10 is connected to an end of a cable harness 20 as shown at (a) of FIG. 1. Although not illustrated here, two or more pairs of signal lines shielded by a cable shield are provided, in the cable harness 20, and two or more pair lines are provided in each cable shield. Each pair line includes a pair of signal lines and a drain line. In an inner space of the enclosure 10, each pair line is connected to a terminal 30 provided to the other end of the enclosure 10.

In addition, shielding covers (not illustrated) are provided at a connecting point of the enclosure 10 and the cable harness 20, and at a connecting point of the enclosure 10 and the terminal 30 so that noise intrusion and leakage are reduced.

The enclosure 10 is divided into an enclosure part 11 and an enclosure part 12 as shown at (b) and (c) of FIG. 1. As shown at (c) of FIG. 1, the enclosure parts 11 and 12 have joints 11A and 12A that are shaped like mountains (“^” and “v” shapes). By fitting the joints 11A and 12A together, the enclosure 10 with a fit joint 10A is completed as shown at (b) of FIG. 1.

Cutout parts, including a cutout part 12B, are formed on a first end of the joints 11A and 12A in order to provide an opening for accommodating the cable harness 20 when the enclosure parts 11 and 12 are fit. The cable harness 20 is led to the enclosure parts 11 and 12 from the first end. Only the cutout part 12B provided on the joint 12A of the enclosure part 12 is shown at (c) of FIG. 1; however, a similar cutout part is provided to the joint 11A of the enclosure part 11.

On a second end, which is the end opposite to the first end, of the enclosure part 11, an opening 11B for accommodating the terminal 30 is provided. A cutout part 12C is formed on the enclosure part 12 corresponding to the opening 11B. When the enclosure parts 11 and 12 are fit, the opening 11B is fit to the cutout part 12C.

The joint 10A is formed between the opening on the first end of the enclosure 10 and the opening 11B on the second end. That is, as shown at (c) of FIG. 1, the enclosure part 11 and the enclosure part 12 are structured such that the enclosure 10 is divided into two parts.

Since the enclosure parts 11 and 12 can be separated, connecting the wire harness 20 to the terminal 30 in the inner space of the enclosure 10 is facilitated, i.e., manufacturing the enclosure is facilitated.

Here, shapes of the joints 11A and 12A are described.

As shown in FIG. 1, the joints 11A and 12A are shaped like mountains if viewed from the side, where the shape is constituted by two or more continuous line segments. The length of each line segment that constitutes the mountain shape is 3 mm or less. Here, the cross section of the enclosure parts 11 and 12 at the joints 11A and 12A is formed perpendicular to the sidewall of the enclosure parts 11 and 12.

The length of 3 mm is arrived at as follows. The wavelength of the information signal transmitted by the signal line if the clock frequency is 10 GHz is 3 cm; a safety factor of $1/10$ is applied; and 3 mm is obtained. Generally, the following formula can be used.

Length of a line segment of the mountain shape=(the light speed)/(clock frequency)×(safety factor)

In the case of the present embodiment, it is equal to $(3\times10^{11})/(1\times10^{11})\times(1/10)=3$ mm.

As described above, in the enclosure 10 for the connector, the joints 11A and 12A of the enclosure parts 11 and 12, respectively, are shaped like mountains as viewed from the side, and the length of each line segment constituting the mountain shape is made into $1/10$ of the wavelength of the electromagnetic wave corresponding to an operating frequency (clock frequency).

Since the enclosure parts 11 and 12 have the joints 11A and 12A as described above, the information signal transmitted by the signal line is prevented from leaking to the exterior of the enclosure 10. Further, noise is prevented from entering the enclosure 10 from the outside.

As described above, the joint 10A of the enclosure parts 11 and 12 is shaped like mountains by line segments having the length based on the wavelength of the operating frequency, and the enclosure 10 for the connector is appropriate for the high-speed and high-density balanced transmission with the leakage and noise intrusion reduced.

In addition, the mountain shape described above is structured by two line segments that form an apex having a desired angle.

Further, the safety factor is not limited to $1/10$ that is described above; rather it can be suitably changed according to applications and purposes of the enclosure 10. If the length of each of the line segments that constitutes the mountain shape is shorter than the wavelength of the operating frequency, the leakage and noise intrusion can be reduced.

Further, since the terminal 30 usually provides a noise shielding structure, the joint of opening 11B and the cutout part 12C are linearly formed; nevertheless, the opening 11B and the cutout part 12C may be shaped like mountains like the joints 11A and 12B if desired.

Further, although the opening 11B is provided in the enclosure part 11, the opening 11B may be divided into two parts such that the divided parts are provided in the enclosure part 11 and enclosure part 12.

Further, although the cross section of the enclosure parts 11 and 12 at the joints 11A and 12A, respectively, is formed perpendicular to the sidewall of the enclosure parts 11 and 12, respectively, according to Embodiment 1, the cross section at the joints 11A and 12A may have a desired angle relative to the sidewall of the enclosure parts 11 and 12, respectively.

Although the enclosure 10 is divided into two parts according to Embodiment 1, the enclosure 10 may be divided into three or more parts.

Further, the shapes of the opening 11B, the cutout part 12B, and the cutout part 12C may be suitably adjusted according to the cross-sectional shapes of the cable harness 20 and the terminal 30.

Figure 2:
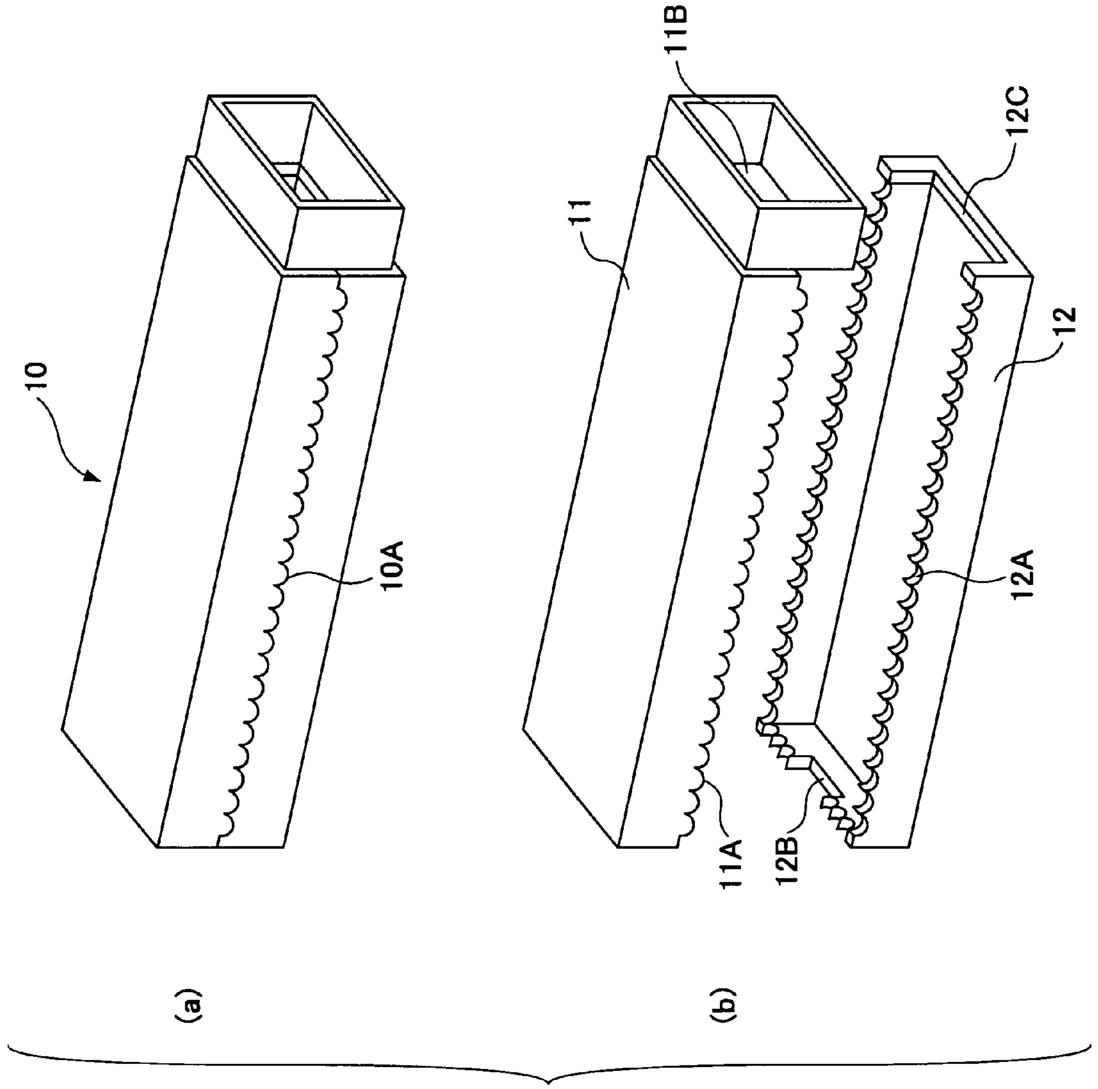
FIG. 2 is a perspective diagram showing a variation of the composition of the enclosure for the connector.
Figure 3:
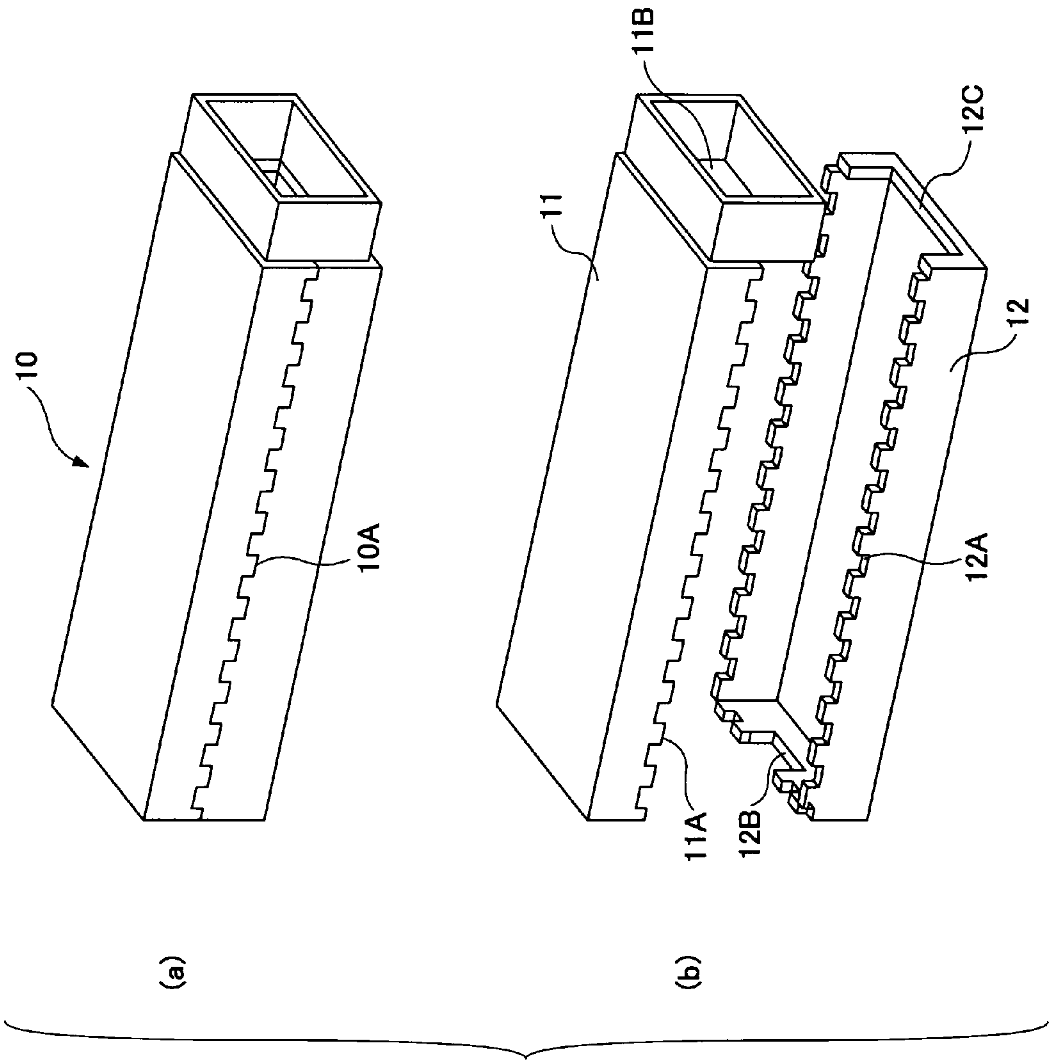
FIG. 3 is a perspective diagram showing another variation of the composition of the enclosure for the connector.
Figure 4:
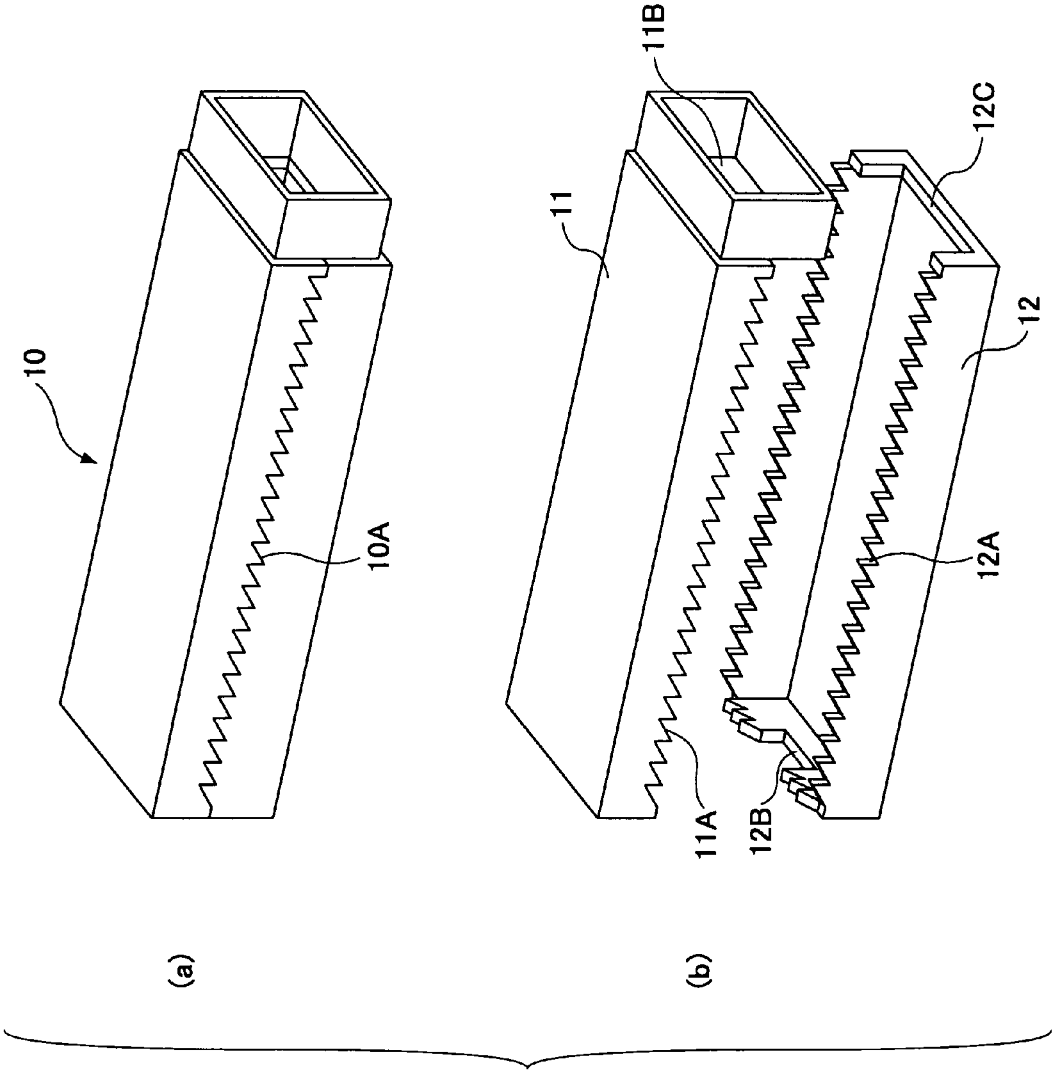
FIG. 4 is a perspective diagram showing another variation of the composition of the enclosure for the connector.

FIGS. 2 through 4 are perspective diagrams showing variations of the enclosure 10 for a connector of Embodiment 1.

The joint 10A (constituted by 11A and 12A) of the enclosure 10 for a connector shown in FIG. 2 is formed by curved lines, wherein each curved line is shaped like a semicircle at the same phase. The length of each semicircle of the joints 11A and 12A is determined based on the wavelength of the operating frequency. Further, the semicircles are continuously connected at the same phase.

Figure 6:
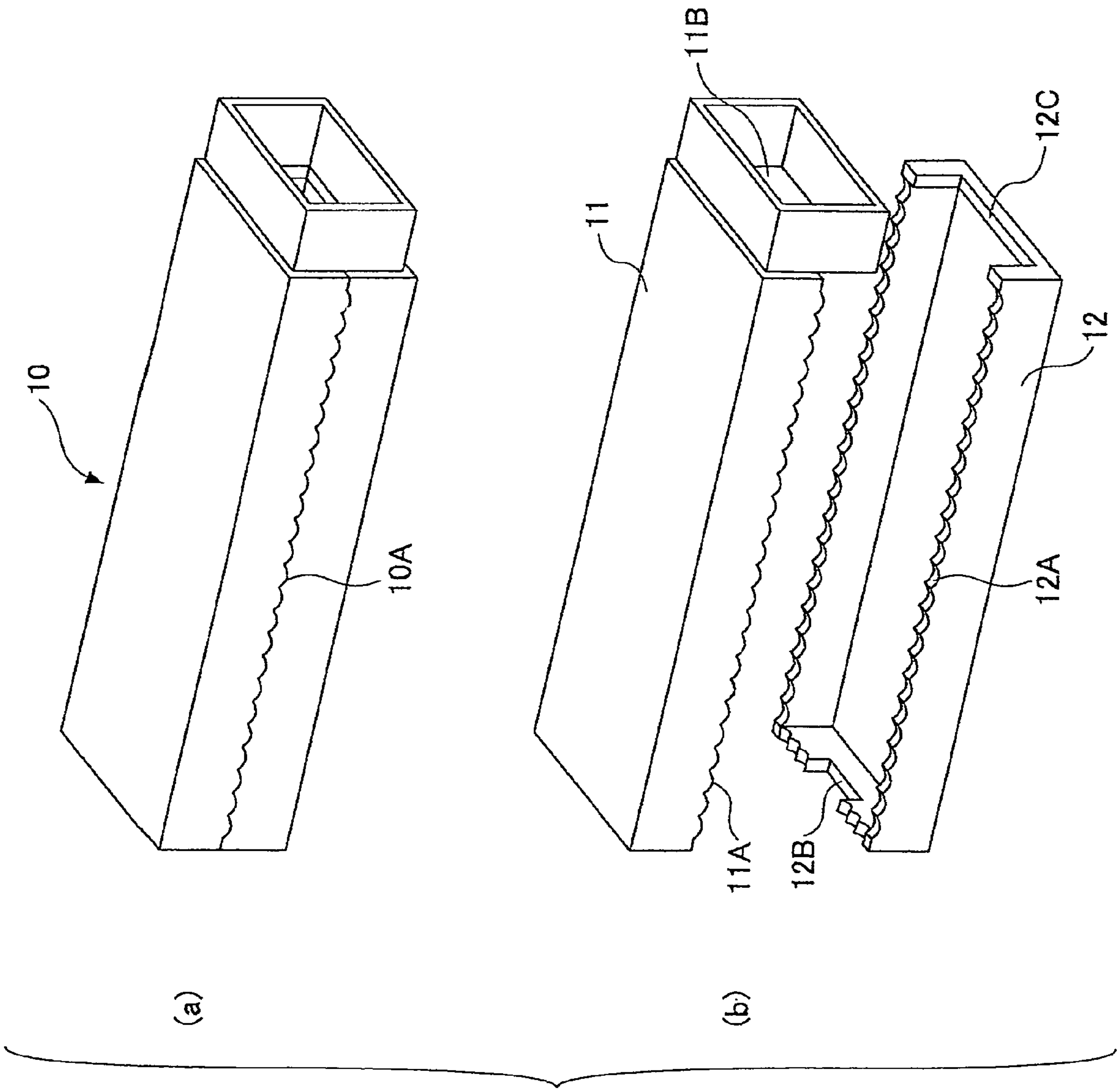
FIG. 6 is a perspective diagram showing another variation of the composition of the enclosure for the connector.

Here, the semicircular shape of the joints 10A (11A and 12A) shown in FIG. 2 may be structured by sinusoidal-wave shapes, each shape being of equal to or less than ½ cycle period, wherein the sinusoidal-wave shapes are continuously connected at the same phase, as shown in FIG. 6.

The joint 10A (constituted by 11A and 12A) of the enclosure 10 for a connector shown in FIG. 3 is shaped like rectangular pulses each pulse constituted by two or more straight lines that are continuously connected. The length of the straight line segment of the joints 11A and 12A is determined based on the wavelength of the operating frequency.

The joint 10A (constituted by 11A and 12A) of the enclosure 10 for a connector shown in FIG. 4 is shaped like a saw-wave pulse constituted by two or more straight lines that are continuously connected. The length of the straight line segment of the joints 11A and 12A is determined based on the wavelength of the operating frequency.

According to the enclosures 10 shown in FIG. 2 through FIG. 4, which are variations of the enclosure shown in FIG. 1, noise intrusion and leakage can be reduced.

Figure 5:
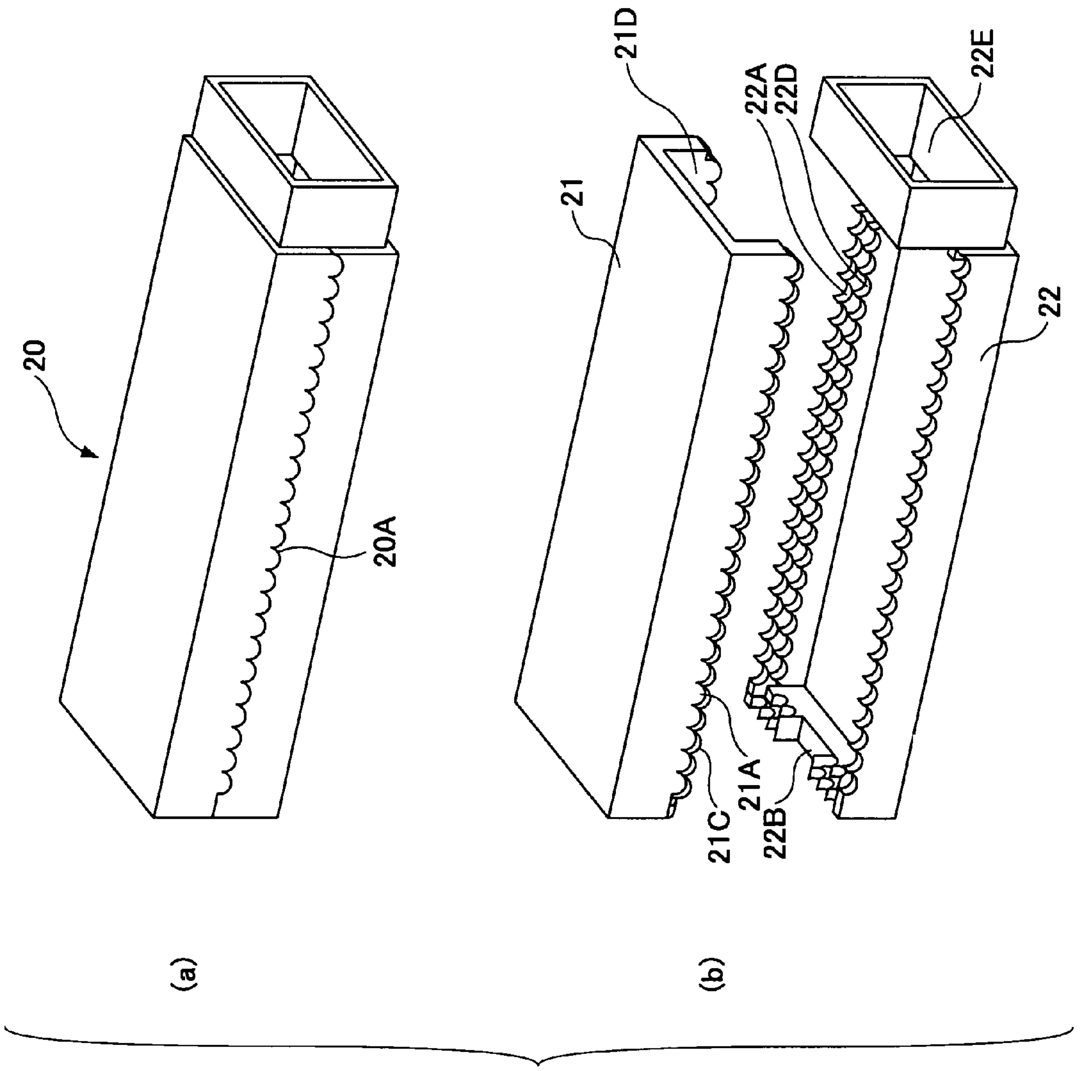
FIG. 5 is a perspective diagram showing the composition of the enclosure for the connector according to Embodiment 2 of the present invention.

FIG. 5 is a perspective diagram showing an enclosure 20 for a connector according to another embodiment of the present invention. The enclosure 20 differs from the enclosure 10 described above in that the joint has a two-step configuration as described below.

The enclosure 20 shown in FIG. 5 has a joint 20A like the enclosure 10 described above, and is divided by the joint 20A in two pieces, namely, enclosure parts 21 and 22.

The enclosure part 21 described above includes two or more joints, here, two joints 21A and 21C that are separately arranged in a thickness direction of a sidewall of the enclosure part 21, the joints being separated by a level difference. The joint 21A is shaped by a continuation of curved line parts, each having a convex semicircle shape at the same phase. The joint 21 C is shaped the same as the joint 21A.

Here, the length of each semicircle of the joints 21A and 21C is determined based on the wavelength of the operating frequency; further, the phase of the joint 21A is made different from the phase of the joint 21C by ½ the length of the semicircle.

Similarly, the enclosure part 22 includes joints 22A and 22D that are separated by a level difference in a thickness direction of a sidewall of the enclosure part 22. The joint 22A is shaped by a continuation of curved line parts. Each curved line part has a concave semicircle shape at the same phase. The joint 22D is shaped the same as the joint 22A.

In order that the joints 22A and 22D may fit the joints 21A and 21C, respectively, of the enclosure part 21 (that is, such that the concave and the convex parts properly fit), the length of each concave semicircle is determined based on the wavelength of the operating frequency, and the phase of the joint 22A is shifted from the phase of the joint 22D by ½ the length of the semicircle.

Here, a cutout part 21D, a cutout part 22B, and an opening 22E are the same as the cutout part 12C, the cutout part 12B, and the opening 11 B, respectively, described above.

As also described above, since the two steps of joints are prepared for the enclosure parts with the level difference separating the joints in the thickness direction of the sidewall, wherein the length of the semicircle shape is determined based on the wavelength of the operating frequency, as shown in FIG. 5, the enclosure for a connector for a high-speed and high-density balanced transmission is realized, which enclosure reduces noise intrusion and leakage.

Although the enclosure 20 is described as having two separable enclosure parts, the enclosure 20 may be separated into three or more parts.

Further, the shape of the joint may be adjusted according to the shape of the connector, and the shapes of the terminal and the cable harness.

Further, although the phase difference between the joints 21A and 21C, and the phase difference between 22A and 22D are defined as being equal to ½ of the semicircle, the amount of the phase difference is not limited to this, but may take a different value so long as the enclosure parts 21 and 22 can fit by the joints 21A and 22A fitting the joints 21C and 22D, respectively.

Further, an embodiment is described above wherein two joints are provided in steps, the joints being separated by the level difference in the thickness direction of the sidewall, the number of steps of the joints separately arranged with level differences may be three or more.

Further, the present invention is not limited to these embodiments, but variations and modifications may be made without departing from the scope of the present invention.

The present application is based on Japanese Priority Application No. 2007-159036 filed on Jun. 15, 2007 with the Japanese Patent Office, the entire contents of which are hereby incorporated by reference.

What is claimed is:

1. An enclosure for a connector, an inner space of which enclosure accommodates a connection section wherein a signal line for transmitting an information signal and a terminal for sending/receiving the information signal between the signal line and an external apparatus are connected, the enclosure comprising:

first and second enclosure parts that are fit together to constitute the enclosure, wherein the enclosure is made of a conductive material, and wherein the enclosure parts include joints for the enclosure parts to be fit together, each joint includes a plurality of one of linear sections and curved sections, and a length of each section is smaller than a wavelength corresponding to a frequency of the information signal; and a plurality of steps of the one of the linear sections and the curved sections formed on a same sidewall of the first enclosure part and the second enclosure part, wherein the steps are arranged in a thickness direction of the same sidewall of the corresponding enclosure part, and are positioned at different heights of the same sidewall.

2. The enclosure as claimed in claim 1, wherein a shape of the joint is a rectangular shape constituted by the linear sections, and wherein straight line segments are continuously connected.

3. The enclosure as claimed in claim 1, wherein the joints are either formed perpendicular to the sidewall on which the joint is formed, or formed at any angle to the sidewall.

4. The enclosure as claimed in claim 1, wherein the first enclosure part and the second enclosure part, when they are fit together, provide a first opening on a first end for leading the signal line into the inner space, the terminal is arranged at a second opening provided on a second end opposite the first end, and the joints of the first enclosure part and the second enclosure part are formed between the first opening and the second opening.

5. The enclosure as claimed in claim 1, wherein the steps of the one of the linear sections and the curved sections are arranged with different phase angles.

6. The enclosure as claimed in claim 1, wherein a shape of the joint is a mountain shape constituted by the linear sections, and wherein straight line segments are continuously connected.

7. The enclosure as claimed in claim 1, wherein a shape of the joint is a saw-tooth shape constituted by the linear sections, and wherein straight line segments are continuously connected.

8. The enclosure as claimed in claim 1, wherein a shape of the joint is a continuation of semicircles at the same phase, serving as the curved line part.

9. The enclosure as claimed in claim 1, wherein a shape of the joint is a continuation of sinusoidal-wave shapes for a period equal to or less than ½ cycle at the same phase, serving as the curved line part.

10. An enclosure for an electrical connector, comprising:

a plurality of enclosure parts that are fit together, wherein the enclosure is made of a conductive material, wherein the enclosure parts include joints for the enclosure parts to fit together, wherein each joint includes a plurality of one of linear sections and curved sections, wherein the plurality of one of the linear sections and curved sections of one of the joints continuously contacts the plurality of one of the linear sections and curved sections of another joint, wherein a length of each section is smaller than a wavelength corresponding to a frequency of the information signal, and wherein a plurality of steps of the one of the linear sections and the curved sections are formed on the first enclosure part and the second enclosure part, which steps are arranged in a thickness direction of a sidewall of the corresponding enclosure part, and are positioned at different heights of the sidewall.

11. The enclosure as claimed in claim 10, wherein a shape of the joint is a rectangular shape constituted by the linear sections, and wherein straight line segments are continuously connected.

12. The enclosure as claimed in claim 10, wherein a shape of the joint is a mountain shape constituted by the linear sections, and wherein straight line segments are continuously connected.

13. The enclosure as claimed in claim 10, wherein a shape of the joint is a saw-tooth shape constituted by the linear sections, and wherein straight line segments are continuously connected.

14. The enclosure as claimed in claim 10, wherein a shape of the joint is a continuation of semicircles at the same phase, serving as the curved line part.

15. The enclosure as claimed in claim 10, wherein a shape of the joint is a continuation of sinusoidal-wave shapes for a period equal to or less than ½ cycle at the same phase, serving as the curved line part.

16. The enclosure as claimed in claim 10, wherein the joint of the enclosure part is either formed perpendicular to a sidewall surface of the enclosure part on which the joint is formed, or formed at any angle to the sidewall surface.

17. The enclosure as claimed in claim 10, wherein the enclosure parts include a first enclosure part having a joint, and a second enclosure part having a joint that fits the joint of the first enclosure part, the first enclosure part and the second enclosure part, when they are fit together, provide a first opening on a first end, a second opening is provided on a second end opposite the first end, and the joints of the first enclosure part and the second enclosure part are formed between the first opening and the second opening.

18. The enclosure as claimed in claim 10, wherein the steps of the one of the linear sections and the curved sections are arranged with different phase angles.

* * * * *